(12) United States Patent
Hashimoto et al.

(10) Patent No.: US 11,456,665 B2
(45) Date of Patent: Sep. 27, 2022

(54) SEMICONDUCTOR DEVICE, ELECTRONIC SYSTEM DEVICE, AND DRIVING METHOD THEREOF

(71) Applicant: RENESAS ELECTRONICS CORPORATION, Tokyo (JP)

(72) Inventors: Kazuya Hashimoto, Tokyo (JP); Kazuya Uejima, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 290 days.

(21) Appl. No.: 16/827,198

(22) Filed: Mar. 23, 2020

(65) Prior Publication Data

US 2020/0321861 A1    Oct. 8, 2020

(30) Foreign Application Priority Data

Apr. 3, 2019  (JP) .............................. JP2019-071675

(51) Int. Cl.
*H02M 1/36* (2007.01)
*H02M 3/155* (2006.01)
*H02M 1/00* (2006.01)

(52) U.S. Cl.
CPC ............. *H02M 3/155* (2013.01); *H02M 1/36* (2013.01); *H02M 1/0006* (2021.05)

(58) Field of Classification Search
CPC .................................................. H02M 1/0006
See application file for complete search history.

(56) References Cited

U.S. PATENT DOCUMENTS

| 2003/0067045 A1* | 4/2003 | Sugiyama | H01L 21/26586 257/E21.507 |
| 2004/0264088 A1* | 12/2004 | Hooper | H02H 3/24 361/92 |
| 2011/0115436 A1* | 5/2011 | Zhang | B60L 58/12 320/134 |
| 2012/0025608 A1* | 2/2012 | Melanson | H02M 7/06 307/43 |

FOREIGN PATENT DOCUMENTS

JP        2001-218387 A        8/2001

* cited by examiner

*Primary Examiner* — Peter M Novak
(74) *Attorney, Agent, or Firm* — McDermott Will & Emery LLP

(57) ABSTRACT

An electronic system device includes a semiconductor device and a power generating device for generating a power supply voltage. The semiconductor device includes a control circuit coupled with the power generating device via a power supply node, and a substrate-biased control circuit coupled with the control circuit. The electronic system device includes a DC-DC converter, and a switch arranged between the power supply nodes and the DC-DC converter. The control circuit sets the switch to an ON state after receiving the power supply voltage. The DC-DC converter receives the power supply voltage after the switch is controlled to the ON state. The substrate bias control circuit supplies a substrate bias voltage to the control circuit before the DC-DC converter receives the power supply voltage.

13 Claims, 7 Drawing Sheets

SEMICONDUCTOR DEVICE, ELECTRONIC SYSTEM DEVICE, AND DRIVING METHOD THEREOF

CROSS-REFERENCE TO RELATED APPLICATIONS

The disclosure of Japanese Patent Application No. 2019-071675 filed on Apr. 3, 2019 including the specification, drawings and abstract is incorporated herein by reference in its entirety.

BACKGROUND

The present invention relates to a semiconductor device, an electronic system device and a method of driving the electronic system device. For example, the present invention can be applied to a semiconductor device and an electronic system device driven by a power supply voltage generated by a power generating device, and a method of driving the electronic system device.

In recent years, an energy harvest (environmental power generation) technique for obtaining electric power from energy, such as sunlight energy, vibration energy, and thermal energy and driving an electronic system device based on the electric power has been provided. The electronic system device includes a semiconductor device and an interface device. The interface device may be either a radio device or a sensing device.

In addition to the semiconductor device and the interface device, the electronic system device using the energy harvest technique may be provided with a DC-DC (Direct Current-Direct Current) converter for supplying a stable voltage to the interface device.

There are disclosed techniques listed below.
[Patent Document 1] Japanese unexamined Patent Application Publication No. 2001-218387

Patent Document 1 discloses an electric double-layer capacitor storage power supply device including a solar battery, a load controller and a DC-DC converter as the electronic system device using the energy harvest technique. Patent Document 1 discloses that the standby power consumed by the DC-DC converter is eliminated.

SUMMARY

However, since the electric double-layer capacitor storage power supply device of Patent Document 1 includes many devices, a large amount of electric power is required at the time of startup, and there is a possibility that an instantaneous voltage drop occurs. Therefore, there is a problem that the electric double-layer capacitor storage power supply device cannot be stably started.

Other objects and novel features will become apparent from the description of this specification and the accompanying drawings.

An electronic system device according to one embodiment includes a power generating device for generating a first power supply voltage. The electronic system device also includes a semiconductor device. The semiconductor device includes a control circuit coupled with the power generating device via a first power supply node and a substrate bias control circuit coupled with the control circuit. The electronic system device includes a DC-DC converter coupled with the power generating device in parallel with the control circuit via the first power supply node. The electronic system device further includes a first switch arranged between the first power supply node and the DC-DC converter and coupled with the first power supply node and the DC-DC converter. The control circuit includes a field-effect transistor. The control circuit also sets the first switch from an OFF state to an ON state after receiving the first power supply voltage. The DC-DC converter receives the first power supply voltage via the first switch after the first switch is controlled to the ON stat. The substrate bias control circuit supplies a substrate bias voltage to the field-effect transistor before the DC-DC converter receives the first power supply voltage.

In a method of driving an electronic system device according to one embodiment, the electronic system device includes a power generating device for generating a first power supply voltage. The electronic system device also includes a semiconductor device. The semiconductor device includes a control circuit coupled with the power generating device via a power supply node and a substrate bias control circuit coupled with the control circuit. The control circuit includes a field-effect transistor. The electronic system device includes a DC-DC converter coupled with the power generating device in parallel with the control circuit via the power supply node. The electronic system device further includes a switch arranged between the power supply node and the DC-DC converter and coupled with the power supply node and the DC-DC converter. In the method of driving the electronic system, the control circuit receives the first power supply voltage via the power supply node. The switch is set from an OFF state to an ON state by the control circuit after the control circuit receives the first power supply voltage. The DC-DC converter receives the first power supply voltage via the switch after the switch is controlled to the ON state. The substrate bias control circuit supplies a substrate bias voltage to the field-effect transistor before the DC-DC converter receives the first power supply voltage.

A semiconductor system device according to one embodiment is driven by a power supply voltage generated by a power generating device and controls a DC-DC converter. the semiconductor device includes a first terminal coupled with the power generating device, a control circuit including coupled with the first terminal via a power supply node, and a substrate bias control circuit coupled with the control circuit. the semiconductor device includes a second terminal coupled with the first terminal in parallel with the control circuit via the power supply node and coupled with the DC-DC converter. the semiconductor device includes a switch arranged between the power supply node and the second terminal and coupled with the power supply node and the second terminal. The control circuit includes a field-effect transistor. The control circuit also sets the switch from an OFF state to an ON state after receiving the power supply voltage. The second terminal supplies the power supply voltage to the DC-DC converter after the switch is controlled to the ON state. The substrate bias control circuit supplies a substrate bias voltage to the field-effect transistor before the second terminal supplies the power supply voltage to the DC-DC converter.

According to the embodiments, the semiconductor device and the electronic system device can be stably started based on the power supply voltage generated by the power generating device.

DETAILED DESCRIPTION

In the following embodiments, when required for convenience, the description will be made by dividing into a plurality of sections or embodiments, but except when specifically stated, they are not independent of each other, and one is related to the modified example, some or all of the other, applications, detailed description, supplementary description, and the like.

In the following embodiments, the number of elements, including the number of constituent elements, numerical values, quantities, ranges etc., is not limited to the specific number, but may be not less than or equal to the specific number, except for cases where the number is specifically indicated and is clearly limited to the specific number in principle.

Furthermore, in the following embodiments, the constituent elements (including the operation steps and the like) are not necessarily essential except in the case where they are specifically specified and the case where they are obviously essential in principle.

Similarly, in the following embodiments, when referring to the shapes, positional relationships, and the like of components and the like, it is assumed that the shapes and the like are substantially similar to the shapes and the like, except for the case in which they are specifically specified and the case in which they are obviously essential in principle, and the like.

First Embodiment

Configuration of Electronic System Device

Figure 1:
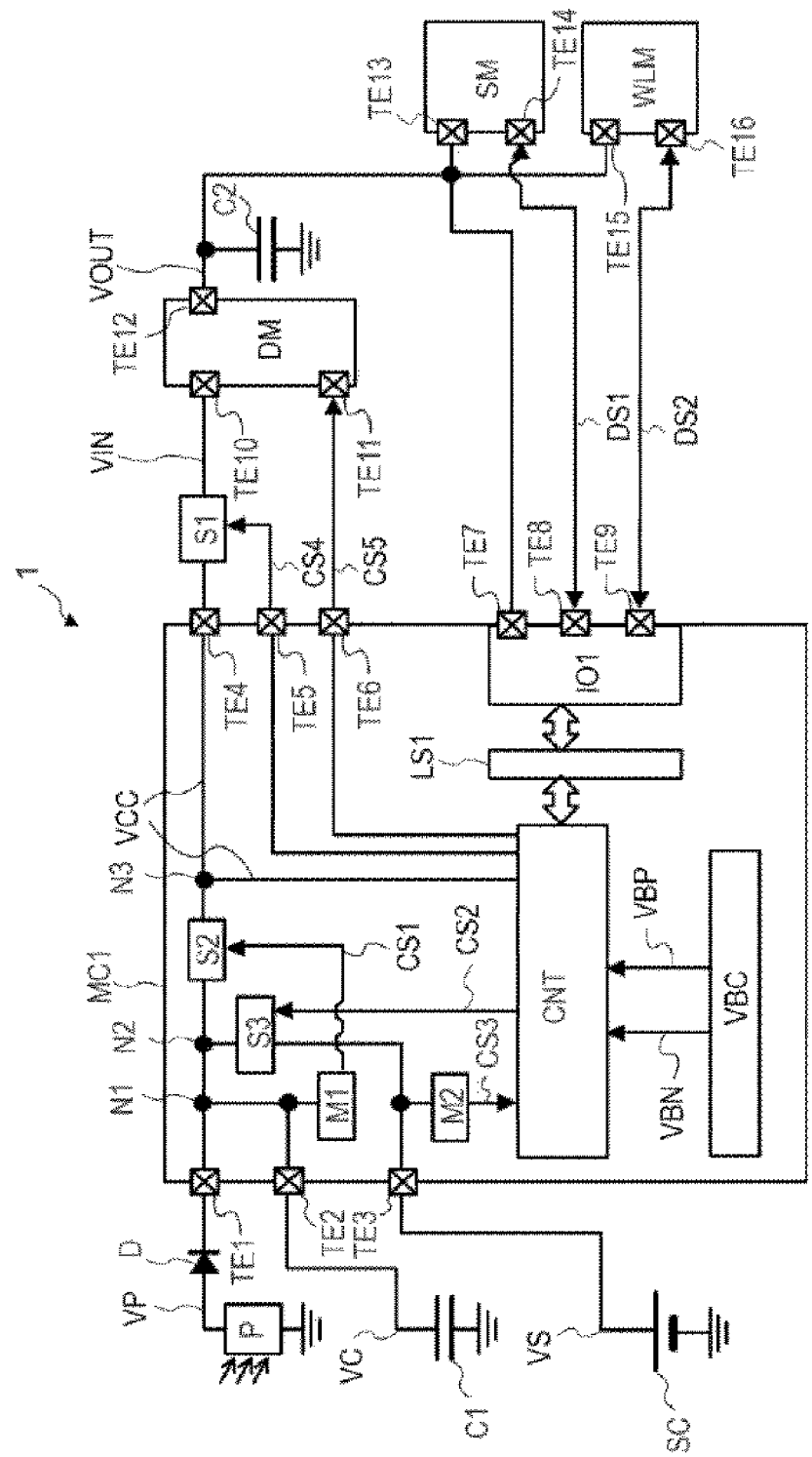
FIG. 1 is a block diagram illustrating a configuration example of an electronic system device according to a first embodiment.

FIG. 1 is a block diagram illustrating a configuration example of an electronic system device 1 according to a first embodiment.

The electronic system device 1 includes a power generating device P, a diode D, condensers C1 and C2, a secondary battery SC, a semiconductor device MC1, a switch S1, a DC-DC converter DM, and interface circuits SM and WLM. The electronic system device 1 is driven based on the energy harvest technique. In other words, the semiconductor device MC1, the DC-DC converter DM, and the interface circuits SM and WLM in the electronic system device 1 are driven based on the energy harvest technique. The interface circuits SM and WLM are devices for interacting with an outside of the electronic system device 1. in the first embodiment, the interface circuit SM is a sensing device and the interface circuit WLM is a wireless device. FIG. 1 shows the case where two interface circuits are provided, but the number of interface circuits is not limited to the case. The condensers C1 and C2 and the secondary battery SC may be capacitors. Further, in the electronic system device 1, the operating voltages of the interface circuits SM and WLM differ from an operating voltage of a control circuit CNT in the semiconductor device MC1.

The power generating device P outputs a power for driving the electronic system device 1. For example, a current outputted by the power generating device P is 5 µA. The power generating device P generates a power supply voltage for driving the semiconductor device MC1, the DC-DC converter DM, and the interface circuits SM and WLM. The power generating device P of the first embodiment is a solar battery. However, the power generating device P is not limited to the solar battery and may be a micro power source, such as a thermocouple and an antenna for receiving a weak radio wave, which can only supply lower power. That is, the electronic system device 1 according to the first embodiment is activated by using the power generating device P which collects energy obtained under environment and outputs the electric power. The power generating device P is coupled with a terminal TE1 of the semiconductor device MC1 via the diode D. The power generating device P generates a power supply voltage VP and supplies the power supply voltage VP to the terminal TE1 via the diode D.

The semiconductor device MC1 includes terminals TE1, TE2, TE3, TE4, TE5, TE6, TE7, TE8 and TE9, switches S2 and S3, monitor circuits M1 and M2, the control circuit CNT, a substrate bias control circuit VBC, a level shift circuit LS1, and an dedicated input/output circuit IO1. The semiconductor device MC1 includes a built-in capacitance (not shown in FIG. 1). The semiconductor device MC1 controls the DC-DC converter DM. The semiconductor device MC1 performs the data signal communication with the interface circuits SM and WLM.

The terminal TE1 is coupled with the monitor circuit M1 and the terminal TE2 via a power supply node N1. The terminal TE2 is coupled with the condenser C1. That is, the monitor circuit M1 and the condenser C1 are coupled in parallel to the terminal TE1 via the power supply node N1. The terminal TE1 supplies the power supply voltage VP to the terminal TE2 via the power supply node N1. Accordingly, the terminal TE2 supplies the power supply voltage VP to the condenser C1. Therefore, the charges outputted from the power generating device P are accumulated in the condenser C1 via the terminals TE1 and TE2 and the power supply node N1, and the condenser C1 obtains the power supply voltage VP as a power supply voltage VC. Mainly, the condenser C1 is provided to supply a stable voltage to the control circuit CNT.

The terminal TE1 is coupled with the switch S2 via the power supply node N1 and a power supply node N2. The switch S2 is coupled with the control circuit CNT and the terminal TE4 via a power supply node N3. That is, the switch S2 is arranged between the power generating device P and the power supply node N3. As described above, the monitor circuit M1 is coupled with the power supply node N1 between the switch S2 and the power generating device P. That is, the monitor circuit M1 monitors a power supply voltage of the power supply node N1 between the terminal TE1 and the terminal TE2, and controls the switch S2 based on the power supply voltage VC of the power supply node N1. Specifically, the monitor circuit M1 supplies a control signal CS1 to the switch S2, and sets the switch S2 to ON/OFF state. When the power supply voltage VC is higher than a threshold voltage, the monitor circuit M1 supplies a high level control signal CS1 to the switch S2, and sets the switch S2 from an OFF state to an ON state. That is, by the monitor circuit M1, the power supply voltage VC is supplied as a power supply voltage VCC to the power supply node N3 via the switch S2.

The control circuit CNT and the terminal TE4 are coupled in parallel to the switch S2 via the power supply node N3. That is, the power supply voltage VCC is supplied to the control circuit CNT and the terminal TE4 via the power supply node N3. Therefore, the control circuit CNT and the terminal TE4 are coupled to the power generating device P via the switch S2 and the power supply node N3, and receive the power supply voltage VP generated by the power generating device P as the power supply voltage VCC. The terminal TE4 supplies the power supply voltage VCC as a power supply voltage VIN to the DC-DC converter DM via the switch S1.

Further, the terminal TE1 is coupled to the switch S3 via the power supply nodes N1 and N2. The switch S3 is coupled with the power supply node N2 between the power supply node N1 and the switch S2. The switch S3 is set to ON/OFF state based on a control signal CS2 from the control circuit CNT. The switch S3 is coupled with the terminal TE3 and the monitor circuit M2. Specifically, the terminal TE3 and the monitor circuit M2 are coupled in parallel with the switch S3. The terminal TE3 is coupled to the secondary battery SC. That is, the charges outputted by the power generating device P are accumulated in the secondary battery SC via the terminals TE1 and TE3, the power supply nodes N1 and N2, and the switch S3, and the secondary battery SC obtains the power supply voltage VP as a power supply voltage VS. Mainly, the secondary battery SC is provided to supply a stable voltages to the DC-DC converter DM. The monitor circuit M2 monitors a power supply voltage between the switch S3 and the terminal TE3 and supplies a control signal CS3 to the control circuit CNT. Specifically, the monitor circuit M2 supplies a high level the control signal CS3 to the control circuit CNT when the power supply voltage VS is higher than a threshold voltage.

The control circuit CNT supplies a control signal CS4 to the switch S1 via the terminal TE5 and controls the switch S1. The control circuit CNT also supplies the control signals CS2 to the switch S3 and controls the switch S3. The control circuit CNT also supplies a control signal CS5 to a terminal TE11 of the DC-DC converter DM via the terminal TE6 and controls the DC-DC converter DM. In addition, the control circuit CNT controls the dedicated input/output circuit IO1 via the level shift circuit LS1. The control circuit CNT includes a built-in capacitance (not shown in FIG. 1).

Further, the control circuit CNT includes a field-effect transistor. The field-effect transistor is, for example, a SOTB (Silicon on Thin Buried Oxide) transistor or a MOS (Metal Oxide Semiconductor) transistor. In this embodiment, the MOS transistor is distinguished from the SOTB transistor and is called a bulk transistor. The SOTB transistor means a transistor using a substrate in which a thin insulating film and a silicon thin film are formed over a silicon substrate. A p-type SOTB transistor means the SOTB transistor in which a channel through which a drain current flows is a p-type channel, and a n-type SOTB transistor means the SOTB transistor in which a channel through which a drain current flows is a n-type channel. Similarly, the MOS transistor whose channel is a p-channel is referred to as a p-type MOS transistor, and the MOS transistor whose channel is a n-type channel is referred to as a n-type MOS transistor.

The control circuit CNT may be composed of only SOTB transistor, or may be composed of only MOS transistor. Of course, the control circuit CNT may be composed of both SOTB and MOS transistors. The detailed structures of the SOTB transistor and the MOS transistor will be described later with reference to FIGS. 2 and 3.

The substrate bias control circuit VBC is coupled with the control circuit CNT and controls the substrate bias voltages of the field-effect transistors in the control circuit CNT. Specifically, the substrate bias control circuit VBC supplies a substrate bias voltage VBP and a substrate bias voltage VBN to the control circuit CNT, controls the threshold voltages of the field-effect transistors in the control circuit CNT, and suppresses the leakage current.

The dedicated input/output circuit IO1 is coupled with a terminal TE12 of the DC-DC converter DM via the terminal TE7, and receives a power supply voltage VOUT from the DC-DC converter DM via the terminal TE7. The dedicated input/output circuit IO1 operates based on the power supply voltage VOUT. The dedicated input/output circuit IO1 is coupled with a terminal TE14 of the interface circuit SM via the terminal TE8. The dedicated input/output circuit IO1 receives a data signal DS1 from the interface circuit SM via the terminal TE8 or supplies the data signal DS1 to the interface circuit SM. Further, the dedicated input/output circuit IO1 is coupled to a terminal TE16 of the interface circuit WLM via the terminal TE9. The dedicated input/output circuit IO1 receives a data signal DS2 from the interface circuit WLM via the terminal TE9 or supplies the data signal DS2 to the interface circuit WLM.

The level shift circuit LS1 is arranged between the control circuit CNT and the dedicated input/output circuit IO1. Since the operating voltage of the control circuit CNT differs from an operating voltage of the dedicated input/output circuit IO1, the level shift circuit LS1 enables communication between the control circuit CNT and the dedicated input/output circuit IO1.

The switch S1 is coupled with the terminal TE4 of the semiconductor device MC1 and a terminal TE10 of the DC-DC converter DM, and is arranged therebetween. In other words, the switch S1 is arranged between the power supply node N3 and the DC-DC converter DM, and is coupled with the power supply node N3 and the DC-DC converter DM. The switch S1 is set to an ON/OFF state based on the control signal CS4. The power supply voltage VCC is supplied to the DC-DC converter DM via the switch S1, as the power supply voltage VIN.

The DC-DC converter DM includes the terminals TE10, TE11, and TE12. Furthermore, the DC-DC converter DM includes a built-in capacitance, which is not shown in FIG. 1. For example, the built-in capacitance is a condenser coupled with the terminal TE10. The condenser may be arranged inside the DC-DC converter DM or outside the DC-DC converter DM, as long as it is coupled with the terminal TE10. In other words, the built-in capacitance may be a condenser coupled between the switch S1 and the terminal TE10 of the DC-DC converter DM. Further, it is not limited to a condenser, and may be a capacitor. The DC-DC converter DM receives the power supply voltage VIN from the power supply device P via the semiconductor device MC1, generates the power supply voltage VOUT having a voltage value different from a voltage value of the power supply voltage VIN, and supplies the power supply voltage VOUT.

Specifically, the DC-DC converter DM receives the power supply voltage VIN from the terminal TE4 of the semiconductor device MC1 via the switch S1 and the terminal TE10. That is, the DC-DC converter DM is coupled with the power generating device P in parallel with the control circuit CNT via the power supply node N3, and receives at least the power supply voltage VP generated by the power generating device P as the power supply voltage VIN. Accordingly, the DC-DC converter DM start up. Further, the DC-DC converter DM generates the power supply voltage VOUT based on a control signal CS5 inputted from the terminal TE11, and supplies the power supply voltage VOUT via the terminal TE12. In particular, the DC-DC converter DM does not supply the power supply voltage VOUT unless the DC-DC converter DM receives a high level control signal CS5. a value of power supply voltage VOUT differs from the values of the power supply voltages VP, VIN, VCC, and VS. For example, the power supply voltage V OUT is 3.3 V and the power supply voltage VIN is 2.6 V. The terminal TE12 of the DC-DC converter DM is coupled with the condenser C2, the terminal TE7 of the semiconductor device MC1, a terminal TE13 of the interface circuit SM, and a terminal TE15 of the interface circuit WLM, and supplies the power supply voltage VOUT to each of them.

The condenser C2 is coupled with the terminal TE13 of the interface circuit SM, the terminal TE15 of the interface circuit WLM, and the terminal TE12 of the DC-DC converter DM. The condenser C2 is mainly used for removing ripples from the DC-DC converter DM.

The interface circuit SM includes the terminals TE13 and TE14. The interface circuit SM receives the power supply voltage VOUT from the terminal TE12 of the DC-DC converter DM via the terminal TE13 and thereby starts up. The interface circuit SM senses the outside of the electronic system device 1. Accordingly, the interface circuit SM supplies the data signal DS1 to the terminal TE8 of the semiconductor device MC1 via the terminal TE14. Alternatively, the interface circuit SM receives the data signals DS1 from the semiconductor device MC1. In other words, the semiconductor device MC1 and the interface circuit SM communicate the data signal DS1.

The interface circuit WLM includes the terminals TE15 and TE16. The interface circuit WLM receives the power supply voltage VOUT via the terminal TE15 and thereby starts up. The interface circuit WLM performs wireless communication with the outside of the electronic system device 1. Accordingly, the interface circuit WLM supplies the data signal DS2 to the terminal TE9 of the semiconductor device MC1 via the terminal TE16. Alternatively, the interface circuit WLM receives the data signal DS2 from the semiconductor device MC1. In other words, the semiconductor device MC1 and the interface circuit WLM communicate the data signal DS2.

Configuration of MOS Transistor and SOTB Transistor

Figure 2:
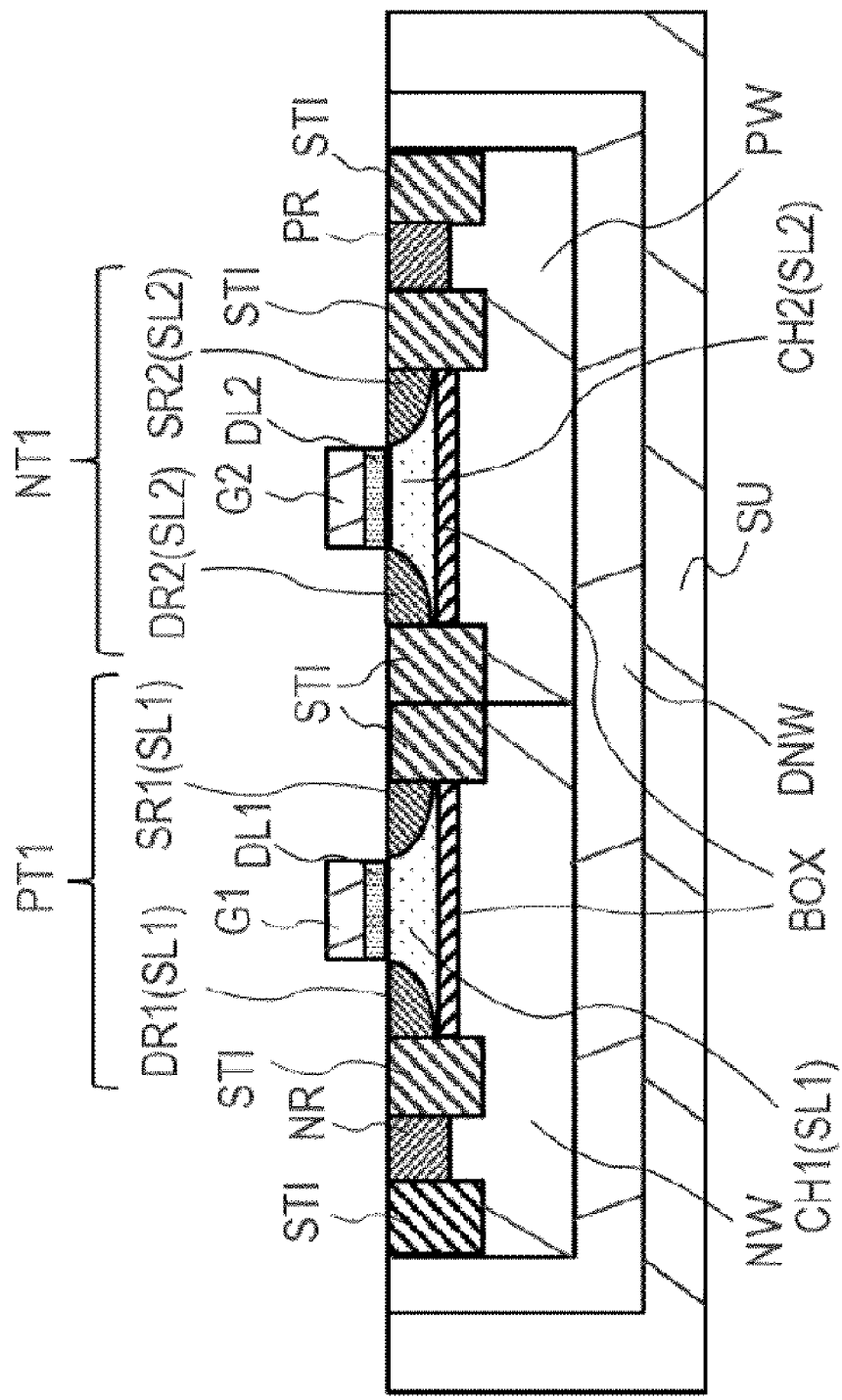
FIG. 2 is a cross-sectional diagram illustrating a configuration example of a SOTB transistor.

FIG. 2 is a cross-sectional diagram illustrating a configuration example of the SOTB transistor.

When the control circuit CNT is formed of the SOTB transistors, the control circuit CNT includes a p-type SOTB transistor PT1 and a n-type SOTB transistor NT1. In the SOTB transistor, a deep n-type well region DNW is formed on a p-type substrate SU.

In the p-type SOTB transistor PT1, a n-type well region NW is formed on the n-type well region DNW. A thin insulating film BOX is formed on the n-type well region NW. A semiconductor layer SL1 is formed on the n-type well region NW so as to sandwich the thin insulating film BOX. A p$^+$-type region SR1 serving as a source region of the p-type SOTB transistor PT1 and a p$^+$-type region DR1 serving as a drain region of the p-type SOTB transistor PT1 are formed in the semiconductor layer SL1. In the semiconductor layer SL1, a channel region CH1 which does not substantially contain an impurity is formed between the p$^+$-type region SR1 and the p$^+$-type region DR1. An impurity concentration of the channel region CH1 is equal to or smaller than $3\times10^{17}$ cm$^{-3}$. A gate electrode G1 of the p-type SOTB transistor PT1 is formed on the channel region CH1 via a gate insulating film DL1.

In the n-type SOTB transistor NT1, a p-type well region PW is formed on the n-type well region DNW. A thin insulating film BOX is formed on the p-type well region PW. A semiconductor layer SL2 is formed on the p-type well region PW so as to sandwich the thin insulating film BOX. A n$^+$-type region SR2 serving as a source region of the n-type SOTB transistor NT1 and a n$^+$-type region DR2 serving as a drain region of the n-type SOTB transistor NT1 are formed in the semiconductor layer SL2. In the semiconductor layer SL2, a channel region CH2 which does not substantially contain an impurity is formed between the n$^+$-type region SR2 and the n$^+$-type region DR2. An impurity concentration of the channel region CH2 is equal to or smaller than $3\times10^{17}$ cm$^{-3}$. A gate electrode G2 of the n-type SOTB transistor NT1 is formed on the channel region CH2 via a gate insulating film DL2.

A thickness of the thin insulating film BOX is, for example, about 10 nanometers. In the p-type SOTB transistor PT1, a n$^+$-type region NR is formed on the n-type well region NW so that the substrate bias control circuit VBC supplies the substrate bias voltage VBP to the n-type well region NW. In the n-type SOTB transistor NT1, a p$^+$-type region PR is formed on the p-type well region PW so that the substrate bias control circuit VBC supplies the substrate bias voltage VBN to the p-type well region PW. Therefore, the threshold voltages of the p-type SOTB transistor PT1 and the n-type SOTB transistor NT1 are controlled by the substrate bias voltages VBP and VBN supplied from the substrate bias control circuit VBC, and the leakage current is suppressed. Accordingly, the power consumed by the control circuit CNT is reduced. The p-type SOTB transistor PT1, the n-type SOTB transistor NT1, the p$^+$-type region PR, and the n$^+$-type region NR are separated from each other by element isolation films STI.

Figure 3:
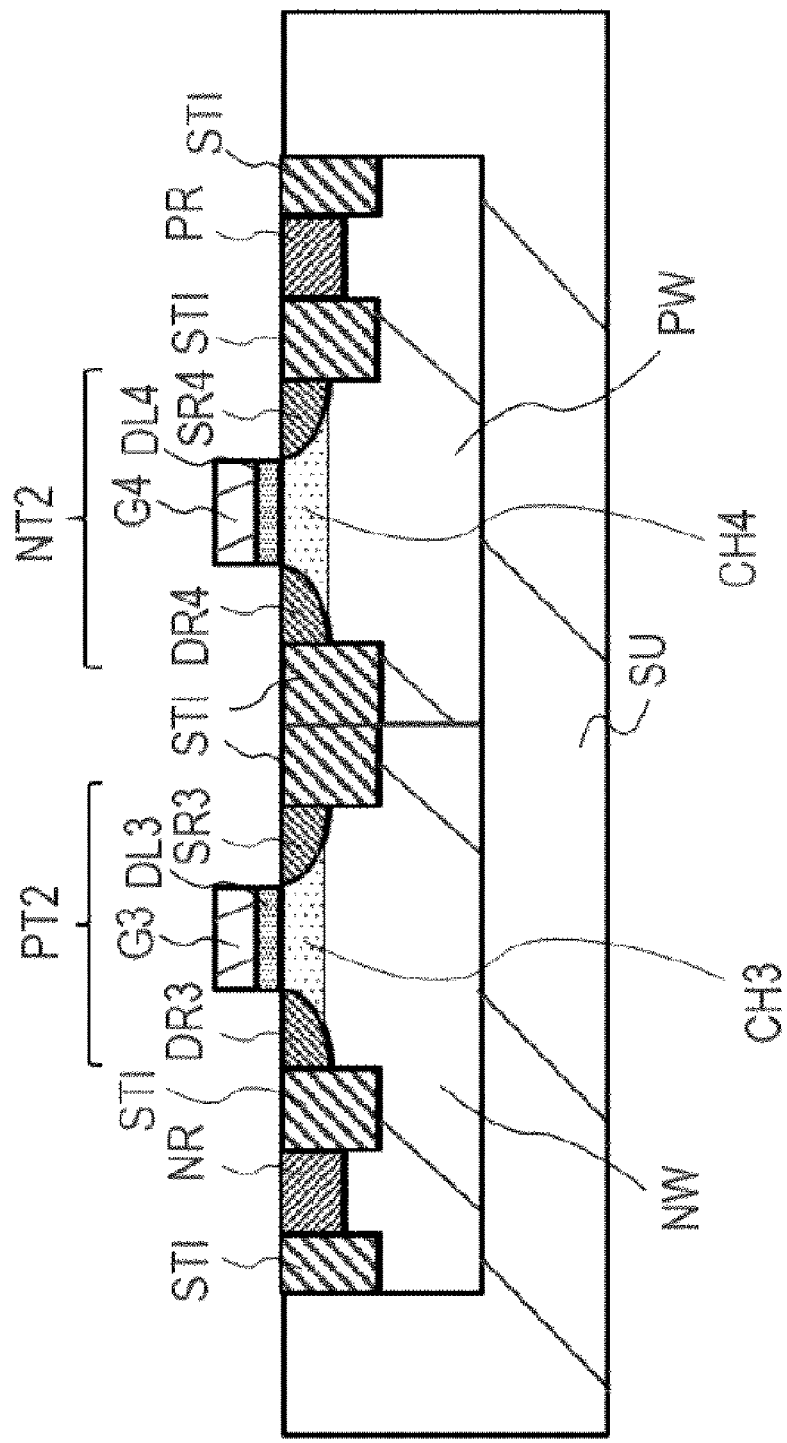
FIG. 3 is a cross-sectional diagram illustrating a configuration example of a MOS transistor.

FIG. 3 is a cross-sectional diagram illustrating a configuration example of the MOS transistor In FIG. 3, the same components as those in FIG. 2 are denoted by the same reference numerals, and a description thereof is omitted. Unlike the SOTB transistor, the insulating film BOX is not formed in the MOS transistor.

When the control circuit CNT is composed of the MOS transistors, the control circuit CNT includes a p-type MOS transistor PT2 and a n-type MOS transistor NT2.

In the p-type MOS transistor PT2, a p$^+$-type region SR3 serving as a source region of the p-type MOS transistor PT2 and a p$^+$-type region DR3 serving as a drain region of the p-type MOS transistor PT2 are formed on the n-type well region NW. A channel region CH3 containing an impurity is formed between the p$^+$-type region SR3 and the p$^+$-type region DR3. A gate electrode G3 of the p-type MOS transistor PT2 is formed on the channel region CH3 via a gate insulating film DL3.

In the n-type MOS transistor NT2, a n$^+$-type region SR4 serving as a source region of the n-type MOS transistor NT2 and a n$^+$-type region DR4 serving as a drain region of the n-type MOS transistor NT2 are formed on the p-type well region PW. A channel region CH4 containing an impurity is formed between the n$^+$-type region SR4 and the n$^+$-type region DR4. A gate electrode G4 of the n-type MOS transistor NT2 is formed on the channel region CH4 via a gate insulating film DL4.

In the p-type MOS transistor PT2, the n$^+$-type region NR is formed on the n-type well region NW so that the substrate bias control circuit VBC supplies the substrate bias voltage VBP to the n-type well region NW. In the n-type MOS transistor NT2, the p$^+$-type region PR is formed on the p-type well region PW so that the substrate bias control circuit VBC supplies the substrate bias voltage VBN to the p-type well region PW. Therefore, the threshold voltages of the p-type MOS transistor PT2 and the n-type MOS transistor NT2 are controlled by the substrate bias voltages VBP and VBN supplied from the substrate bias control circuit VBC, and the leakage current is suppressed. Accordingly, the power consumed by the control circuit CNT is reduced.

However, in the n-type MOS transistor NT2 and the p-type MOS transistor PT2, the channel region CH3 and the channel region CH4 are formed in the n-type well region NW and the p-type well region PW, respectively, which contain the impurity. For example, when a plurality of p-type MOS transistors PT2 is formed in the control circuit CNT, a plurality of n-type well regions NW is also formed. When the impurity concentrations of the plurality of n-type well regions NW vary from one another, the threshold voltages of the plurality of p-type MOS transistors PT2 vary from one another. In addition, a p-n junction exists between the n-type well region NW and the source/drain regions of the p-type MOS transistor PT2. Therefore, in the p-type MOS transistor PT2, when the substrate bias control circuit VBC supplies the substrate bias voltage VBP to the n-type well region NW, a leakage current due to the p-n junction is generated. The same applies to the n-type MOS transistor NT2 as described above.

In contrast, in the p-type SOTB transistor PT1 and the n-type SOTB transistor NT1, the channel region CH1 in the semiconductor layer SL1 and the channel region CH2 in the semiconductor layer SL2 do not substantially contain the impurities. Therefore, it is possible to lessen the variation in the threshold voltages of the p-type SOTB transistor PT1 and the n-type SOTB transistor NT1 caused by the variation in the amount of the impurities. In addition, since no impurities are substantially contained, the threshold voltages of the p-type SOTB transistor PT1 and the n-type SOTB transistor NT1 are changed in proportion to the substrate bias voltages VBP and VBN. Further, in the p-type SOTB transistor PT1, since the source region and the drain region of the p-type SOTB transistor PT1 are formed in the semiconductor layer SL1, there is no p-n junction with the well region NW. Therefore, it is possible to prevent the leakage current caused by the p-n conjunction. Since the insulating film BOX is interposed between the well region NW and the semiconductor layer SL1 serving as the channel region in the p-type SOTB transistor PT1, it is possible to prevent the leakage current from flowing between the semiconductor layer SL1 and the well region NW even when the substrate bias voltage VBP is supplied. As a result, the SOTB transistor operates stably while achieving the reduction of the power consumption. The same applies to the n-type SOTB transistor NT1 as described above. Therefore, the SOTB transistor can consume less power than the MOS transistor.

When the control circuit CNT is composed of both the SOTB transistor and the MOS transistor, the substrate bias voltage VBP supplied to the n-type well region NW of the SOTB transistor and the substrate bias voltage VBP supplied to the n-type well region NW of the MOS transistor may be different voltages. Similarly, the substrate bias voltage VBN supplied to the p-type well region PW of the SOTB transistor and the substrate bias voltage VBN supplied to the p-type well region PW of the MOS transistor may be different voltages. In other words, the substrate bias voltages VBP and VBN supplied to the SOTB transistor and the MOS transistor, respectively, may differ.

Operation of Electronic System Device According to First Embodiment

Figure 4:
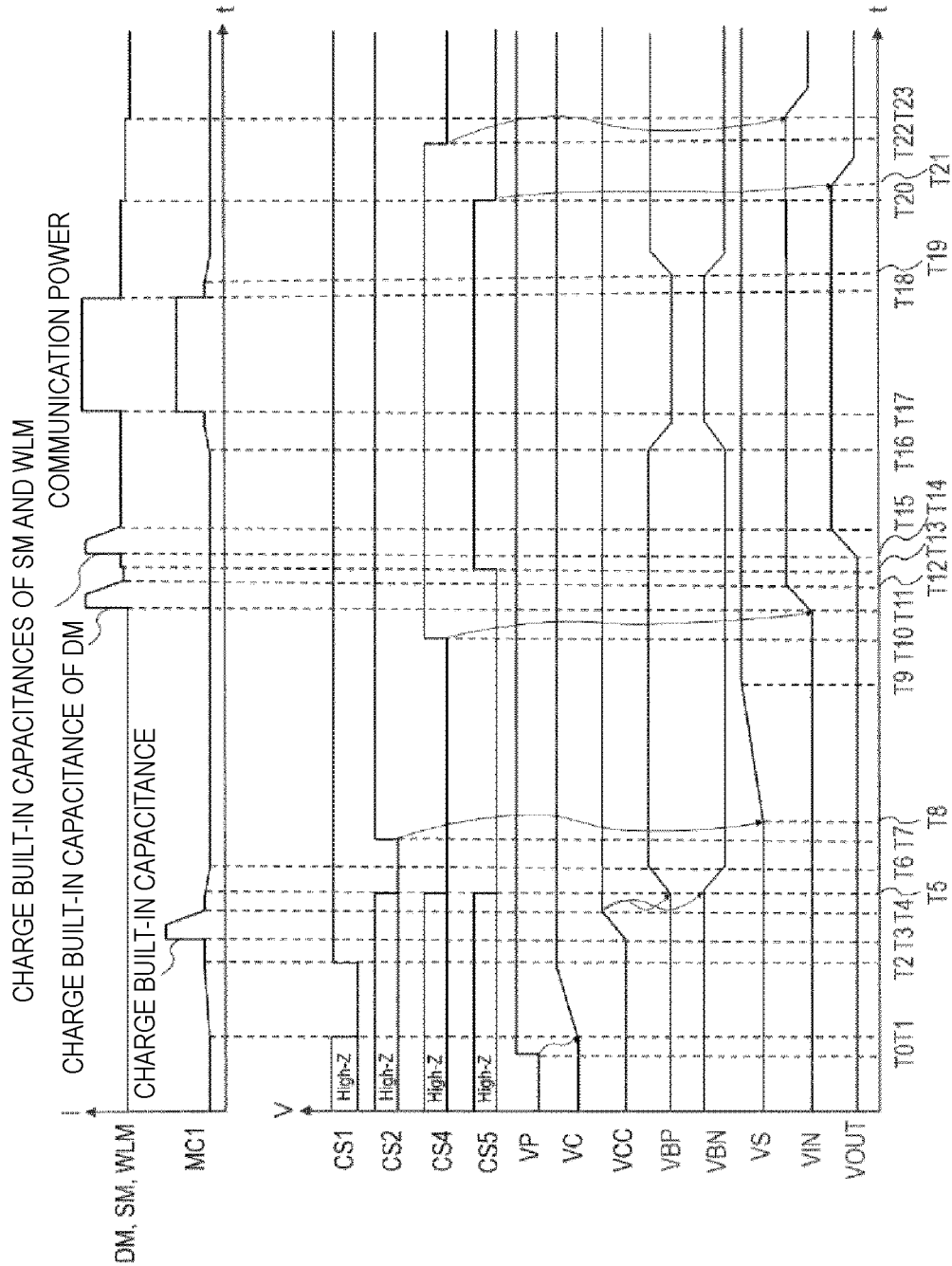
FIG. 4 is a timing chart for explaining an operation of the electronic system device according to the first embodiment.

FIG. 4 is a timing chart for explaining an operation of the electronic system device 1 according to the first embodiment. In the initialization of the electronic system device 1, the switches S1, S2 and S3 are OFF state. Similarly, the control signals CS1, CS2, CS3, CS4 and CS5 are floating (High-Z).

At a time T0, the power generating device P generates the power supply voltage VP by, for example, illumination or sunlight, and supplies the power supply voltage VP.

Accordingly, at a time T1, the power supply voltage VP is supplied from the power generating device P to the condenser C1 via the diode D, the terminal TE1, the power supply node N1, and the terminal TE2, and a charging to the condenser C1 starts. As a result, the condenser C1 obtains the power supply voltage VP as the power supply voltage VC. During the charge period, the switches S1, S2, and S3 are OFF state. In addition, the various built-in capacitances in the semiconductor device MC1 start to be charged, and the semiconductor device MC1 starts up. The monitor circuit M1 is also started, and the monitor circuit M1 sets the control signal CS1 from the floating state to a low level.

The monitor circuit M1 monitors the power supply voltage VC of the power supply node N1. When the power supply voltage VC is higher than the threshold voltage, the monitor circuit M1 transitions the control signal CS1 from the low level to a high level at a time T2, and supplies the control signal CS1 to the switch S2. As a result, the switch S2 is set from the OFF state to an ON state.

Accordingly, at a time T3, the power supply voltage VC is supplied as the power supply voltage VCC via the switch S2. Accordingly, the power supply voltage VCC is supplied to the control circuit CNT and the terminal TE4 via the power supply node N3. That is, the control circuit CNT receives at least the power supply voltage VP generated by the power generating device P. As a result, the built-in capacitances in the semiconductor device MC1 including the control circuit CNT starts to be charged at once. Accordingly, a large starting current flows through the semiconductor device MC1. Since the switch S3 is the OFF state, the power supply voltage VCC is not supplied to the DC-DC converter DM via the switch S3. Therefore, the power supply voltages are not supplied to the interface circuits SM and WLM. As a result, a timing of the starting current of the semiconductor device MC1 differs from a timing of the starting current of other devices, so that the power supply voltage VC of the condenser C1 does not drop at once.

At a time T4, the power supply voltage VCC becomes a high level and the start-up of the control circuit CNT is completed.

Accordingly, at a time T5, the control circuit CNT sets the control signals CS2, CS4 and CS5 from the floating state to the low level. The switch S1 is the OFF state as in the initialization. The substrate bias control circuit VBC also supplies the substrate bias voltages VBP and VBN to the control circuit CNT. Specifically, the substrate bias voltage VBP is a voltage that is a positive potential, and the substrate bias voltage VBN is a voltage that is a negative potential. As a result, the threshold voltages of the field-effect transistors in the control circuit CNT are controlled, and the leakage current of the field-effect transistors is reduced. Accordingly, the power consumed by the semiconductor device MC1 is reduced. Also, while the substrate bias voltages VBP and VBN are being supplied, the semiconductor device MC1 operates in a low-consumption mode. For example, the semiconductor device MC1 of the low-consumption mode operates in synchronization with a low-speed clock signal. In other words, the semiconductor device MC1 operates in a low-speed mode.

After the substrate bias voltage VBP and VBN are supplied at the time T6, the control circuit CNT transitions the control signal CS2 from the low level to a high level at a time T7, and supplies the control signal CS2 to the switch S3. As a result, the switch S3 is set from the OFF state to an ON state. That is, after the control circuit CNT receives the power supply voltage VCC, the control circuit CNT sets the switch S3 to the ON state. The substrate bias control circuit VBC also supplies the substrate bias voltages VBP and VBN to the field-effect transistors of the control circuit CNT before the switch S3 is set to the ON state. This is to reduce the power consumed by the semiconductor device MC1.

Accordingly, at a time T8, a battery charge from the power generating device P to the secondary battery SC via the diode D, the terminal TE1, the power supply nodes N1 and N3, the switch S3, and the terminal TE3 starts. In addition, the secondary battery SC obtains the power supply voltage VP as the power supply voltage VS from the condenser C2. The monitor circuit M2 is also started, and the monitor circuit M2 sets the control signal CS3 from the floating state to a low level.

When the monitor circuit M2 monitors the power supply voltage VS and the power supply voltage VS is higher than the threshold voltage, the monitor circuit M2 transitions the control signal CS3 from the low level to a high level at a time T9. Therefore, the start-up of the semiconductor device MC1 is completed. After the start-up of the semiconductor device MC1 is completed, the semiconductor device MC1 is in a standby mode.

At a time T10, when the semiconductor device MC1 is in the standby state, the semiconductor device MC1 receives an interrupt signal (not shown). Thereby, the control circuit CNT transitions the control signal CS4 from the low level to a high level, and supplies the control signal CS4 to the switch S1 via the terminal TE5. Accordingly, the switch S1 is set from the OFF state to an ON state.

As a result, at a time T11, the power supply voltage VIN is supplied to the terminal TE10 of the DC-DC converter DM. In other words, the DC-DC converter DM receives the power supply voltage VCC as the power supply voltage VIN via the switch S1. The power supply voltage VIN at the time T11 includes at least the power supply voltage VS as well as the power supply voltages VP and VC. Accordingly, the built-in capacitance (not shown) of the DC-DC converter DM starts to be charged, and the DC-DC converter DM starts up. As described above, the built-in capacitance is a capacitor or the like coupled with the terminal TE10. At this time, a large starting current flows through the DC-DC converter DM. Since the start-up of the semiconductor device MC1 has been completed, the timing of the start-up of the DC-DC converter DM does not overlap with the timing of the start-up of the semiconductor device MC1. Therefore, the power supply voltages VC, VS, and VIN do not drop at once. Since the large starting currents are not generated at the same time in the semiconductor device MC1 and the DC-DC converter DM, a voltage drop does not occur instantaneously in the electronic system device 1, and the electronic system device 1 is not reset.

After the power supply voltage VIN reaches a high level at a time T12, the control circuit CNT transitions the control signal CS5 from the low level to a high level at a time T13.

The control circuit CNT supplies the control signal CS5 to the terminal TE11 of the DC-DC converter DM via the terminal TE6.

Accordingly, at a time T14, the DC-DC converter DM supplies the power supply voltage VOUT to the condenser C2, the terminal TE7 of the dedicated input/output circuit IO1, the terminal TE13 of the interface circuit SM, and the terminal TE15 of the interface circuit WLM via the terminal TE12 as an output voltage. As a result, the built-in capacitances of the condenser C2 and the interface circuits SM and WLM are charged. Accordingly, the interface circuits SM and WLM start up. Since the start-ups of the semiconductor device MC1 and the DC-DC converter DM has been completed, the timings of the start-up of the interface circuits SM and WLM do not overlap with the timings of the start-ups of the semiconductor device MC1 and the DC-DC converter DM. Therefore, since the large starting currents is not generated simultaneously in each device of the electronic system device 1, an instantaneous voltage drop in the electronic system device 1 does not occur, and the electronic system device 1 is not reset. Therefore, the electronic system device 1 can be started based on the current of several μA levels outputted from the power generating device P.

After the built-in capacitances of the condenser C2 and the interface circuits SM and the WLM are charged, the start-up of the electronic system device 1 is completed at a time T15. After the start-up of the electronic system device 1 is completed, the electronic system device 1 becomes a standby state.

At a time T16, the semiconductor device MC1 receives an interrupt signal (not shown) when the electronic system device 1 is in the standby state. Accordingly, the substrate bias control circuit VBC stops supplying the substrate bias voltages VBP and VBN to the control circuit CNT. Accordingly, the semiconductor device MC1 starts to operate in a normal mode. For example, the semiconductor device MC1 of the normal mode operates in synchronization with a high-speed clock signal as compared with the semiconductor device MC1 of the low-consumption mode. As a result, the semiconductor device MC1 can perform higher speed processing than the semiconductor device MC1 of the low-consumption mode.

After the substrate bias control circuit VBC stops supplying the substrate bias voltages VBP and VBN, the semiconductor device MC1 starts communication with the interface circuits SM and WLM. Between a time T17 and a time T18, the dedicated input/output circuit IO1 of the semiconductor device MC1 receives the data signal DS1 from the interface circuit SM or supplies the data signal DS1 to the interface circuit SM. The dedicated input/output circuit IO1 also receives the data signal DS2 from the interface circuit WLM or supplies the data signal DS2 to the interface circuit WLM.

After the above-described communication operation is completed, at the time T19, the substrate bias control circuit VBC supplies the substrate bias voltages VBP and VBN to the control circuit CNT. Accordingly, the semiconductor device MC1 operates in the low-consumption mode. As a result, the power consumed by the semiconductor device MC1 can be reduced. In other words, while the semiconductor device MC1 is not performing the communication operation, the semiconductor device MC1 operates in the low-consumption mode, and suppresses the standby current of the semiconductor device MC1. Accordingly, the power consumed by the electronic system device 1 is reduced.

At a time T20, when the semiconductor device MC1 receives an interrupt signal (not shown), the control circuit CNT transitions the control signal CS5 from the high level to the low level.

Accordingly, at a time T21, the DC-DC converter DM stops supplying the power supply voltage VOUT. As a result, the power of the condenser C2 is naturally discharged as a leakage current of the interface circuits SM and WLM, or the like, and the power supply voltage VOUT transitions to the low level.

At a time T22, when the semiconductor device MC1 receives an interrupt signal (not shown), the control circuit CNT transitions the control signal CS4 from the high level to the low level. Accordingly, the switch S1 is set from the ON state to the OFF state.

As a result, at a time T23, the supply of the power supply voltage VIN is stopped. The built-in capacitance of the DC-DC converter DM is discharged spontaneously, and the power supply voltage VIN transitions from the high level to the low level. As a result, the electronic system device 1 shifts to the standby mode. Further, when the switch S1 is set to the ON state, the leakage current of the DC-DC converter DM flows. Therefore, the power consumed by the electronic system device 1 can be reduced by setting the switch S1 to the OFF state.

When the electronic system device 1 operates again, the operation of FIG. 4 may be repeated. Since the electronic system device 1 suppresses the consumption current as described above, the electronic system device 1 can perform an intermittently operation.

Therefore, in the electronic system device 1, the start-up times of the semiconductor device MC1 and the DC-DC converter DM are different, and the start-up timings thereof are also different from the start-up timings of the interface circuits SM and WLM. Therefore, the instantaneous voltage drop in the electronic system device 1 does not occur. As a result, the electronic system device 1 can be stably started without being reset even based on the current of several µA levels outputted from the power generating device P. Further, when the DC-DC converter DM and the interface circuits SM and WLM start up, the semiconductor device MC 1 is operated in the low-consumption mode. Therefore, the electronic system device 1 can be stably started. In the standby mode, since the semiconductor device MC1 operates in the low-consumption mode and suppresses the leakage current of the DC-DC converter DM, the power consumption is low. As a result, in the electronic system device 1, the intermittently operation can is possible even by the energy harvest technique in which the current outputs are unstable.

Modified Example of First Embodiment

Figure 5:
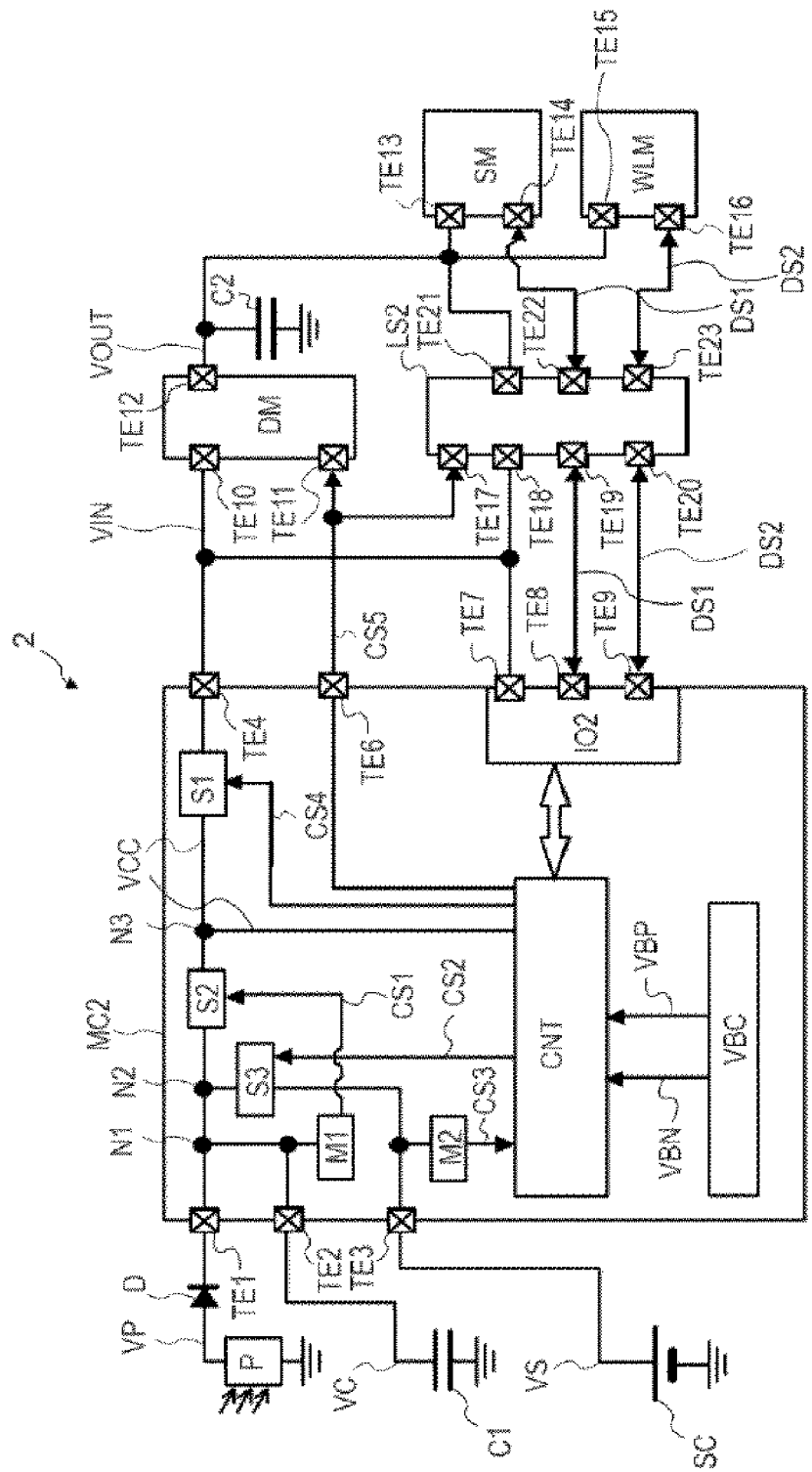
FIG. 5 is a block diagram illustrating a configuration example of an electronic system device according to a modified example of the first embodiment.

FIG. 5 is a block diagram illustrating a configuration example of an electronic system device 2 according to a modified example of the first embodiment. Components similar to those of the electronic system device 1 according to the first embodiment are denoted by the same reference numerals, and descriptions thereof are omitted. The start-up operation of the electronic system device 2 is mainly the same as the start-up operation of the electronic system device 1.

The electronic system device 2, which is the modified example, includes a semiconductor device MC2 and a level shift device LS2, unlike the electronic system device 1. Specifically, unlike the semiconductor device MC1, the semiconductor device MC2 includes the switch S1 in the semiconductor device MC2. The semiconductor device MC2 includes a general-purpose input/output circuit IO2 instead of the dedicated input/output circuit IO1 of the semiconductor device MC1. The general-purpose input/output circuit IO2 operates based on the same power supply voltage as the control circuit CNT. Therefore, the semiconductor device MC2 does not include the level shift circuit LS1 in the semiconductor device MC1. Instead, the electronic system device 2 includes the level shift device LS2 outside the semiconductor device MC2.

In the semiconductor device MC2, the switch S1 is arranged between the power supply node N3 and the terminal TE4. Similar to the operation of semiconductor device MC1, after the control circuit CNT receives the power supply voltage VCC via the power supply node N3, the substrate bias control circuit supplies the substrate bias voltages VBP and VBN to the control circuit CNT. Thereafter, the control circuit CNT sets the switch S1 from the OFF state to the ON state. The terminal TE4 then supplies the power supply voltage VIN to the DC-DC converter DM.

Unlike the dedicated input/output circuit IO1, the general-purpose input/output circuit IO2 receives the power supply voltage VIN from the terminal TE4 via the terminal TE7 and operates based on that power supply voltage. Also, the general-purpose input/output circuit IO2 operates based on the same power supply voltage as the control circuit CNT. Therefore, the control circuit CNT of the semiconductor device MC2 can directly control the general-purpose input/output circuit IO2. The general-purpose input/output circuit IO2 communicates the data signals DS1 and DS2 with the interface circuits SM and WLM via the level shift device LS2.

Since the level shift device LS2 is arranged outside the semiconductor device MC2, the level shift device LS2 includes terminals TE17, TE18, TE19, TE20, TE21, TE22, and TE23. The terminal TE17 receives the control signal CS5 from the control circuit CNT of the semiconductor device MC2, and an operation of the level shift device LS2 starts based on the control signal CS5. The terminal TE18 receives the power supply voltage VIN via the switch S1 of the semiconductor device MC2. The terminal TE21 receives the power supply voltage VOUT from the DC-DC converter DM. The level shift device LS2 operates based on the power supply voltages VIN and VOUT. Accordingly, the interface circuit SM and the general-purpose input/output circuit IO2 communicate the data signal DS1 via the terminals TE19 and TE22. Similarly, the interface circuit WLM and the general-purpose input/output circuit IO2 communicate the data signal DS2 via the terminals TE20 and TE23.

Therefore, in the electronic system device 2, since the switch S1 is formed in the semiconductor device MC2, it is possible to reduce the number of the external devices outside the semiconductor device MC2, and it is also possible to reduce the terminal TE5 of the semiconductor device MC1. Therefore, the electronic system device 2 can be miniaturized.

In addition, even when the operating voltages of the interface devices SM and the WLM are higher than the voltage that can be accepted by the semiconductor device MC2, the level shift device LS2 enables the communication operation among the semiconductor device MC2 and the interface devices SM and WLM. Therefore, the electronic system device 2 is more versatile than the electronic system device 1. Further, similarly to the electronic system device 1, the electronic system device 2 can be stably started based on the current of several µA levels outputted from the power generating device P.

Second Embodiment

Configuration of Electronic System Device

Figure 6:
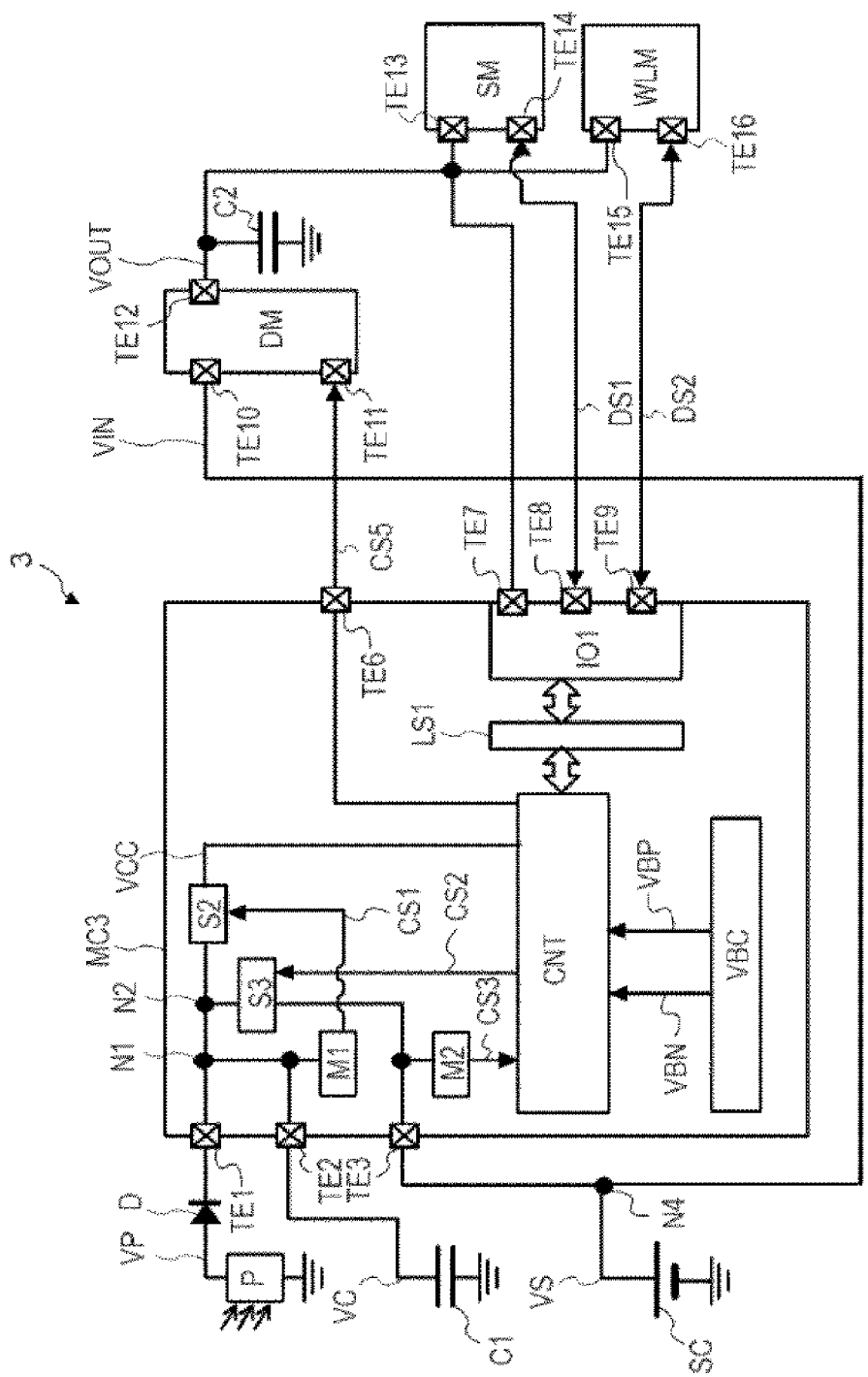
FIG. 6 is a block diagram illustrating a configuration example of an electronic system device according to a second embodiment.

FIG. 6 is a block diagram illustrating a configuration example of an electronic system device 3 according to a second embodiment. Components similar to those of the electronic system device 1 according to the first embodiment are denoted by the same reference numerals, and descriptions thereof are omitted.

The electronic system device 3 according to the second embodiment includes a semiconductor device MC3 instead of the semiconductor device MC1. Further, unlike the electronic system device 1, the electronic system device 3 does not include the switch S1. The switch S3 of the semiconductor device MC3 functions as the switch S1 of the electronic system device 1. The semiconductor device MC3 does not include the terminal TE4. Therefore, the terminal TE3 of the semiconductor device MC3 is coupled with the terminal TE10 of the DC-DC converter DM via a power supply node N4. Therefore, the DC-DC converter DM receives the power supply voltage VIN from the terminal TE3. In the electronic system device 3, the control circuit CNT is coupled with the power generating device P via the power supply node N2, and the DC-DC converter DM is coupled with the power generating device P in parallel with the control circuit CNT via the power supply node N2.

Operation of Electronic System Device According to Second Embodiment

Figure 7:
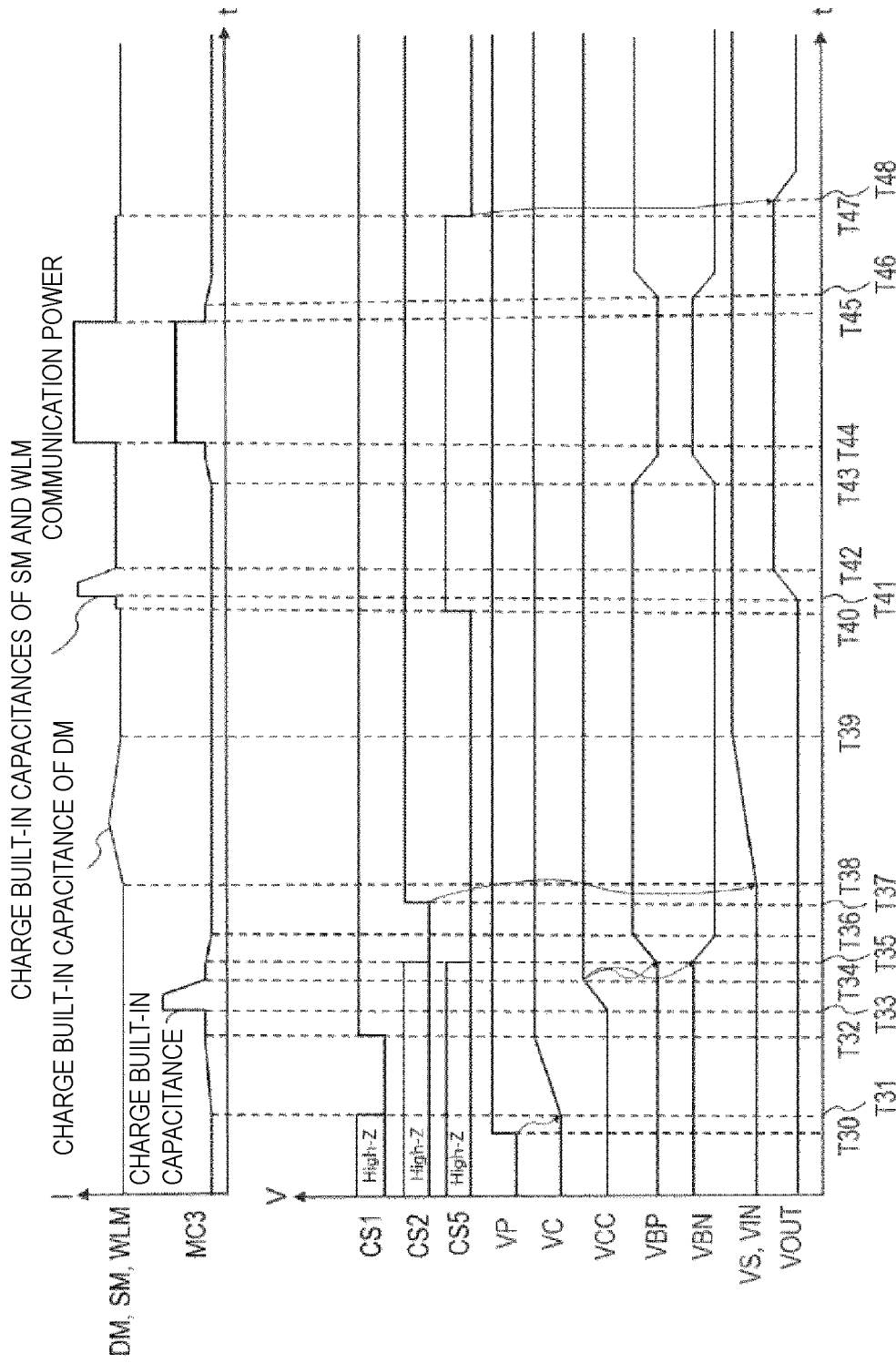
FIG. 7 is a timing chart for explaining an operation of the electronic system device according to the second embodiment.

FIG. 7 is a timing chart for explaining an operation of the electronic system device 3 according to the second embodiment. an initialization of the electronic system device 3 is the same as the initialization of the electronic system device 1.

Since each operation of the electronic system device 3 from a time T30 to a time T37 is the same as each operation of the electronic system device 1 from the time T1 to the time T7, the explanation thereof is omitted. Specifically, an operation at the time T30 corresponds to the operation at the time T0. An operation at a time T31 corresponds to the operation at the time T1. An operation at a time T32 corresponds to the operation at the time T2. An operation at a time T33 corresponds to the operation at the time T3. An operation at a time T34 corresponds to the operation at the time T4. An operation at a time T35 corresponds to the operation at the time T5. An operation at a time T36 corresponds to the operation at the time T6. A time T37 corresponds to the time T7.

After the switch S3 changes from the OFF state to the ON state, at a time T38, a battery charge from the power generating device P to the secondary battery SC via the diode D, the terminal TE1, the power supply nodes N1 and N3, the switch S3, the terminal TE3, and the power supply node N4 starts. As a result, the secondary battery SC obtains the power supply voltage VS. Further, the power supply voltage VS is supplied to the terminal TE10 of the DC-DC converter DM via the power supply node N4 as the power supply voltage VIN. In other words, the power supply voltages VS and VIN are the same. That is, the DC-DC converter DM receives the power supply voltage VIN via the switch S3. Accordingly, the built-in capacitance of the DC-DC converter DM starts to be charged, and the DC-DC converter DM starts to be started. At this time, a start-up current flows through the DC-DC converter DM. Since the start-up of the control circuit CNT of the semiconductor device MC3 has been completed, the timing of the start-up of the DC-DC converter DM does not overlap with the timing of the start-up of the control circuit CNT. Therefore, the power supply voltages VC and VS do not drop at once. Since a large start-up current is not generated at the same time in the semiconductor device MC3 and the DC-DC converter DM, an instantaneous voltage drop does not occur in the electronic system device 3, and the electronic system device 3 is not reset.

A time T39 corresponds to the time T9. Thereby, the start-up of the semiconductor device MC3 is completed. After the start-up of the semiconductor device MC3 is completed, the semiconductor device MC3 is in the standby mode.

After power supply voltages VS and VIN go to the high levels, the semiconductor device MC3 receives interrupt signals (not shown). Accordingly, at a time T40, the control circuit CNT transitions the control signal CS5 from the low level to a high level. The control circuit CNT supplies the control signal CS5 to the terminal TE11 of the DC-DC converter DM via the terminal TE6. This operation corresponds to the operation of the electronic system device 1 at the time T13.

Further, since each operation of the electronic system device 3 from a time T41 to a time T48 is the same as each operation of the electronic system device 1 from the time T14 to the time T20, the explanation thereof is omitted. Specifically, an operation at a time T41 corresponds to the operation at time T14. An operation at a time T42 corresponds to the operation at the time T15. An operation at a time T43 corresponds to the operation at the time T16. An operation at a time T44 corresponds to the operation at the time T17. An operation at a time T45 corresponds to the operation at the time T18. An operation at the time T46 corresponds to the operation at the time T19. An operation at a time T47 corresponds to the operation at the time T20. An operation at a time T48 corresponds to the operation at the time T21, whereby the electronic system device 3 shifts to the standby mode. When the electronic system device 3 is operated, the operation of FIG. 7 may be repeated.

Therefore, the operations of the electronic system device 3 do not include the operations of the electronic system device 1 at the times T10, T11, T12, T22, and T23. As described above, in the electronic system device 3, the switch S1 of the electronic system device 1 is not provided. Instead, the switch S3 of the semiconductor device MC3 functions as the switch S1 of the electronic system device 1. Therefore, since the electronic system device 3 does not include the switch S1 and the terminal TE5 connected to the switch S1, the electronic system device 3 can be more miniaturized than the electronic system device 1. Further, since the electronic system device 3 does not have a control operation by the control signal CS4 of the electronic system device 1, the electronic system device 3 can be started up faster than the electronic system device 1.

Similar to the electronic system device 1, in the electronic system device 3, the start-up times of the semiconductor device MC3 and the DC-DC converter DM are different, and the start-up timings thereof are also different from the start-up timings of the interface circuits SM and WLM. Therefore, a instantaneous voltage drop does not occur in the electronic system device 3. As a result, the electronic system device 3 can be stably started without being reset even based on the current of several µA levels outputted from the power generating device P.

What is claimed is:
1. An electronic system device comprising:
    a power generating device for generating a first power supply voltage;

a semiconductor device including a control circuit coupled with the power generating device via a first power supply node and a substrate bias control circuit coupled with the control circuit;

a DC-DC converter coupled with the power generating device in parallel with the control circuit via the first power supply node; and a first switch arranged between the first power supply node and the DC-DC converter and coupled with the first power supply node and the DC-DC converter, wherein the control circuit includes a field-effect transistor and sets the first switch from an OFF state to an ON state after receiving the first power supply voltage, wherein the DC-DC converter receives the first power supply voltage via the first switch after the first switch is controlled to the ON state, wherein the substrate bias control circuit supplies a substrate bias voltage to the field-effect transistor 1) before the DC-DC converter receives the first power supply voltage, 2) after the control circuit receives the first power supply voltage, and 3) before the first switch is set from the OFF state to the ON state, wherein the field-effect transistor includes:
a substrate;
a well region formed in the substrate;
a semiconductor layer formed on the well region via an insulating film;
a source region, a drain region and a channel region formed in the semiconductor layer; and
a gate electrode disposed on the channel region via a gate insulating film, wherein the substrate bias control circuit supplies the substrate bias voltage to the well region, wherein the electronic system device further includes a first capacitor, wherein the semiconductor device includes:
a second switch arranged between the power generating device and the first power supply node; and
a first monitor circuit coupled via a second power supply node between the second switch and the power generating device, and wherein the first capacitor is coupled with the second power supply node in parallel with the first monitor circuit, and wherein the first monitor circuit controls the second switch based on a voltage of the second power supply node.

2. The electronic system device according to claim 1, further comprising:
a secondary battery,
wherein the semiconductor device includes:
a third switch coupled via a third power supply node between the second power supply node and the second switch; and
a second monitor circuit coupled with the third switch,
wherein the secondary battery is coupled with the third switch in parallel with the second monitor circuit, and
wherein the control circuit sets the third switch from an OFF state to an ON state after the substrate bias control circuit supplies the substrate bias voltage.

3. The electronic system device according to claim 2, further comprising:
a second capacitor,
wherein the second capacitor is coupled with the DC-DC converter.

4. The electronic system device according to claim 1,
wherein the DC-DC converter generates a second power supply voltage that differs from the first power supply voltage.

5. The electronic system device according to claim 4,
wherein the control circuit supplies a control signal to the DC-DC converter after the DC-DC converter receives the first power supply voltage, and
wherein the DC-DC converter generates the second power supply voltage based on the control signal.

6. The electronic system device according to claim 4, further comprising:
an interface device,
wherein the interface device receives the second power supply voltage from the DC-DC converter and supplies a data signal to the semiconductor device.

7. The electronic system device according to claim 6,
wherein the semiconductor device includes an input/output circuit for receiving the second power supply voltage from the DC-DC converter, and
wherein the input/output circuit operates based on the second power supply voltage and receives the data signal from the interface device.

8. The electronic system device according to claim 7,
wherein the substrate bias control circuit stops supplying the substrate bias voltage before the input/output circuit receives the data signal.

9. The electronic system device according to claim 8,
wherein the substrate bias control circuit supplies the substrate bias voltage again after the input/output circuit receives the data signal.

10. The electronic system device according to claim 9,
wherein the control circuit sets the first switch from the ON state to the OFF state after the substrate bias control circuit supplies the substrate bias voltage again.

11. A method of driving an electronic system device, the electronic system device comprising:
a power generating device for generating a first power supply voltage;
a semiconductor device including a control circuit including a field-effect transistor and coupled with the power generating device via a power supply node, and a substrate bias control circuit coupled with the control circuit;
a DC-DC converter coupled with the power generating device in parallel with the control circuit via the power supply node; and
a switch arranged between the power supply node and the DC-DC converter and coupled with the power supply node and the DC-DC converter,
wherein the control circuit receives the first power supply voltage via the power supply node,
wherein the switch is set from an OFF state to an ON state by the control circuit after the control circuit receives the first power supply voltage,
wherein the DC-DC converter receives the first power supply voltage via the switch after the switch is controlled to the ON state,
wherein the substrate bias control circuit supplies a substrate bias voltage to the field-effect transistor 1) before the DC-DC converter receives the first power supply voltage, 2) after the control circuit receives the first power supply voltage, and 3) before the first switch is set from the OFF state to the ON state,
wherein the field-effect transistor includes:
a substrate;
a well region formed in the substrate;

a semiconductor layer formed on the well region via an insulating film;

a source region, a drain region and a channel region formed in the semiconductor layer; and a gate electrode disposed on the channel region via a gate insulating film, wherein the substrate bias control circuit supplies the substrate bias voltage to the well region, wherein the electronic system device further includes a first capacitor, wherein the semiconductor device includes:

a second switch arranged between the power generating device and the power supply node; and a first monitor circuit coupled via a second power supply node between the second switch and the power generating device, and wherein the first capacitor is coupled with the second power supply node in parallel with the first monitor circuit, and wherein the first monitor circuit controls the second switch based on a voltage of the second power supply node.

12. The method of driving the electronic system device according to claim 11, wherein the substrate bias control circuit supplies the substrate bias voltage to the field-effect transistor after the control circuit receives the first power supply voltage and before the switch is set to the ON state.

13. The method of driving the electronic system device according to claim 12, the electronic system device further comprising:

an interface device, wherein the DC-DC converter generates a second power supply voltage that differs from the first power supply voltage, and wherein the interface device receives the second power supply voltage from the DC-DC converter.

* * * * *